United States Patent [19]

Funahashi et al.

[11] Patent Number: 5,484,516
[45] Date of Patent: Jan. 16, 1996

[54] RESIN PRODUCTS AND PROCESS FOR PRODUCING THE SAME

[75] Inventors: Toshikazu Funahashi; Yasuhiko Ogisu; Mamoru Kato; Shigeyuki Takahashi; Toshiya Uemura, all of Aichi, Japan

[73] Assignee: Toyoda Gosei Co., Ltd., Aichi, Japan

[21] Appl. No.: 225,286

[22] Filed: Apr. 8, 1994

[30] Foreign Application Priority Data

| Apr. 9, 1993 | [JP] | Japan | 5-083603 |
| Apr. 9, 1993 | [JP] | Japan | 5-083604 |
| Jul. 1, 1993 | [JP] | Japan | 5-163623 |
| Jul. 27, 1993 | [JP] | Japan | 5-185236 |
| Jul. 27, 1993 | [JP] | Japan | 5-185238 |
| Sep. 17, 1993 | [JP] | Japan | 5-231834 |
| Dec. 20, 1993 | [JP] | Japan | 5-320297 |
| Dec. 20, 1993 | [JP] | Japan | 5-320298 |
| Apr. 1, 1994 | [JP] | Japan | 6-065277 |

[51] Int. Cl.$^6$ ............................ C25D 5/56; C25D 5/02
[52] U.S. Cl. ............................ 205/50; 205/118; 205/122; 205/164
[58] Field of Search ............................ 205/118, 120, 205/122, 164, 135, 50

[56] References Cited

FOREIGN PATENT DOCUMENTS

| 45-037843 | 12/1970 | Japan . |
| 52-050937 | 4/1977 | Japan . |
| 55-152195 | 11/1980 | Japan . |
| 1215617 | 12/1970 | Netherlands . |

OTHER PUBLICATIONS

Derwent Abstract of JP 57-101690 K. Okubo (Jun. 1982).

Primary Examiner—John Niebling
Assistant Examiner—Brendan Mee
Attorney, Agent, or Firm—Cushman Darby & Cushman

[57] ABSTRACT

Contoured step sections and contoured grooves along the step sections are formed on a grille body. The grille body is subjected to chemical plating. Since the grooves have narrow bottoms, the bottoms remain unplated, so that a chemical plating layer is formed on the entire surface of the grille body except for the bottoms. The grille body having the chemical plating layer formed thereon is then subjected to an electroplating step having a plurality of steps. An undercoat plating layer is formed on the chemical plating layer formed on the portions where decorative plating is to be applied. The chemical plating layer formed on the portions where no decorative plating is to be applied is dissolved with a predetermined solution. Subsequently, a general electroplating layer is formed on the undercoat plating layer. Thus, the chemical plating layer and the electroplating layers are formed only on the to-be-plated portions. The plated portions are covered with an electroforming mask, and a coating is applied onto the exposed portions to form a coating layer, where the edges of the electroforming mask can be registered with the edges of the plating layer. Accordingly, the boundaries between the coating layer and the plating layer can clearly be defined.

19 Claims, 18 Drawing Sheets

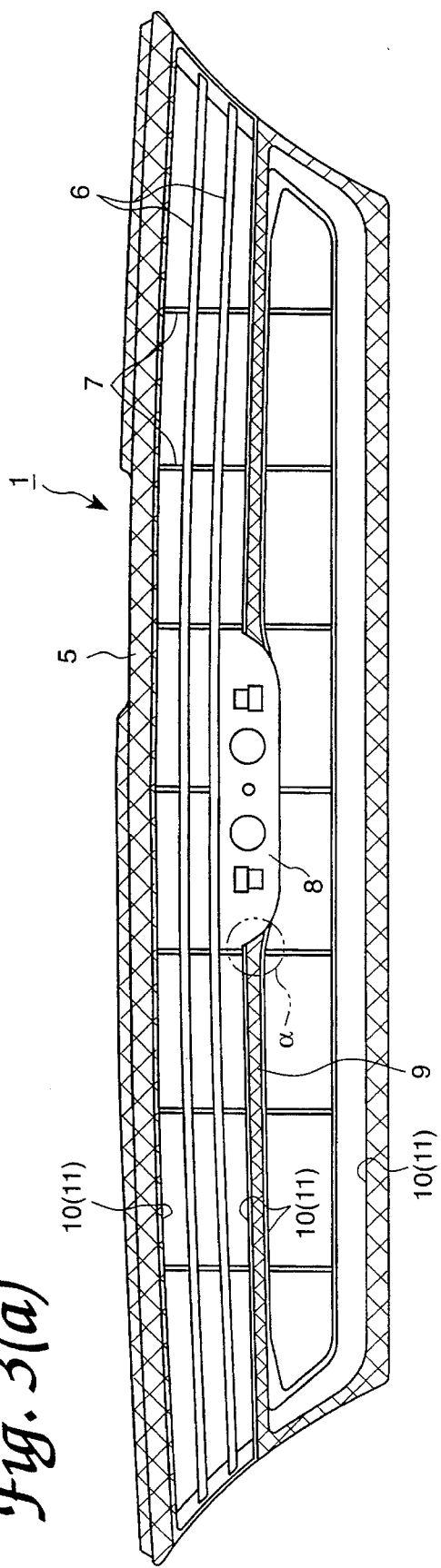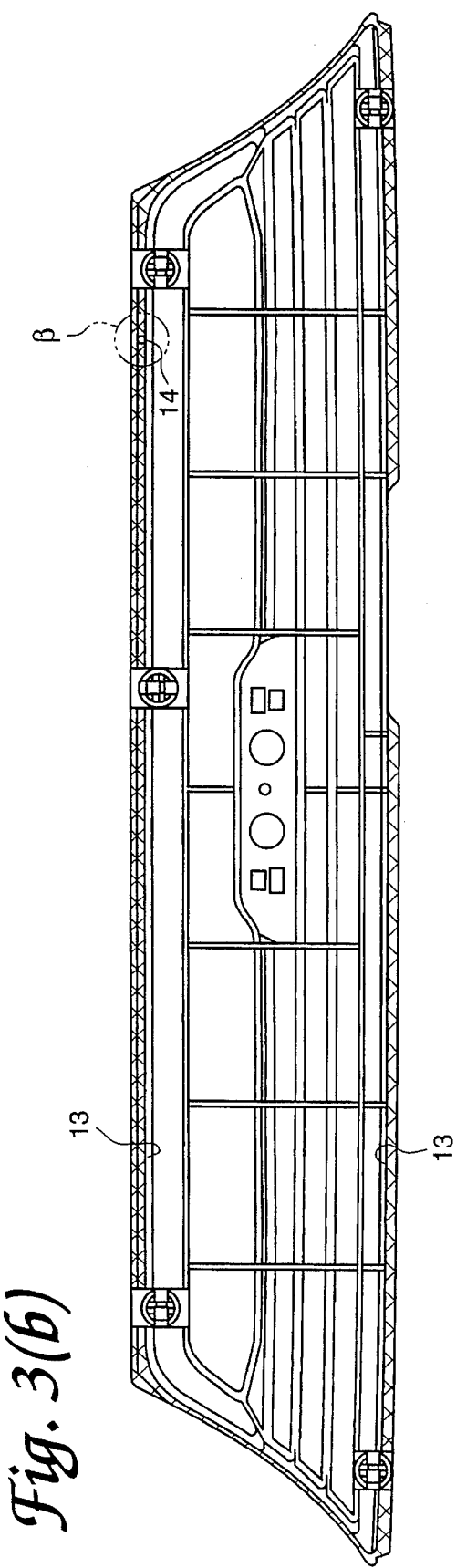
Fig. 3(a)
Fig. 3(b)

RESIN PRODUCTS AND PROCESS FOR PRODUCING THE SAME

This application is based on Japanese Patent Application Nos. 5-83604, 5-163623, 5-231834, 5-185236, 5-185238, 5-83603, 5-320297, 5-320298, and the content of all are expressly incorporated herein by reference.

BACKGROUND OF THE INVENTION

1. Field of the Invention

The present invention relates generally to a resin product and a process for producing the same, more particularly a resin product in which a plating layer is formed only at the required portions on the surface of a resin base material, with a coating layer being formed partly or entirely on the rest of the portions which are defined by the edges of the plating layer.

2. Description of the Related Art

It has generally been proposed to form front grilles of automobiles with resins and to decorate them using plating techniques.

Known techniques are shown in Japanese Examined Patent Publication No. 45-37843 and Japanese Unexamined Patent Publication Nos. 55-152195 and 52-50937. In one of these techniques, as shown in FIG. 26, a contoured groove 72 having a substantially V-shaped cross section is defined on the surface of a base material 71 along the boundary between the to-be-plated or to-be-decorated portion (left side in FIG. 26) and the to-be-unplated portion (right side in FIG. 26). The base material 71 is first subjected to chemical plating, whereby to form a chemical plating layer 73 on the entire surface of the base material 71 except for the bottom 72a of the groove 72. Since the bottom 72a of the groove 72 is too narrow to allow a plating solution to intrude thereon, the chemical plating cannot substantially be applied to the bottom 72a.

The base material 71 having the chemical plating layer 73 formed thereon is then subjected to an electroplating step, as shown in FIG. 27. The base material 71 is first immersed in a predetermined electroplating solution, and then the chemical plating layer 73 formed on the to-be-plated portion is electrically charged to allow an electroplating layer 74 to be formed thereon. The chemical plating layer 73 formed on the to-be-unplated portion is electrically insulated by the presence of the groove 72, so that the chemical plating layer 73 is dissolved by the electroplating solution and removed from the base material 71. Thus, the chemical plating layer 73 and the electroplating layer 74 can be formed on the base material 71 only at the portions where decorative plating is required.

The above-described technique can be applied when automotive exterior resin equipments such as front grilles and back panels are produced. For example, in the case of front grille, a plating layer is formed on the front surface of a front grille base material at predetermined portions, and a coating layer is formed on the rest of the portions (on the front surface). Such front grille can be produced, for example, in the following manner.

First, a front grille base material with a plating layer formed partly thereon is prepared. The portions where the plating layer should remain as such are covered with an electroforming mask. The portions which are not covered with the electroforming mask (exposed portions) are coated with a predetermined coating material by means of spraying. The coating material is dried to form a coating layer. The electroforming mask is then removed to provide a front grille.

However, in the prior art technique described above, the size of the groove 72 is relatively small. Accordingly, it is very difficult to position the electroforming mask on the base material 71 in such a way that the edges of the electroforming mask may accurately be aligned with the edges of the plating layer. Thus, when a coating layer is formed, the boundary between the coating layer and the plating layer tends to be unclear, which diminishes the appearance of the resulting product.

In such cases where the plating layer fails to be fully covered with the electroforming mask, the coating layer is liable only to be partly formed on the plating layer. Accordingly, when a general-purpose coating material (a coating material in which consideration is given only to the adhesion with the base material) is selected and applied, the coating layer tends to separate from the plating layer.

SUMMARY OF THE INVENTION

Accordingly, it is a primary objective of the present invention to provide a resin product on which a plating layer is only formed on designated to-be-plated portions on the surface of a resin base material, with a coating layer being partly or entirely formed on the rest of the portions defined along the edges of the plating layer.

It is another objective of the invention to provide a resin product having definite boundaries between those two layers and also having a good appearance. The product is also free of the coating layer separation even if a general-purpose coating material is used. A further object is to provide a process for producing the same.

To achieve the foregoing and other objects and in accordance with the purpose of the present invention, there is provided a resin product having a decorative plating layer. The resin product comprises a resin base material, provided with to-be-plated portions and to-be-unplated portions; groove-like boundaries formed on the base material so as to define the to-be-plated portions from the to-be-unplated portions, the boundaries allocating predetermined contour lines; a decorative plating layer formed on the to-be-plated portions on the base material, the decorative plating layer consisting of a chemical plating layer formed on the base material and an electroplating layer formed on the chemical plating layer; a coating layer formed on the to-be-unplated portions; and steps formed along the groove-like boundaries, the steps being utilized as guides when a mask for covering the plating layer is to be applied to the base material so as to form the coating layer.

BRIEF DESCRIPTION OF THE DRAWINGS

The features of the present invention that are believed to be novel are set forth with particularity in the appended claims. The invention, together with the objects and advantages thereof, may best be understood by reference to the following description of the preferred embodiments taken in conjunction with the accompanying drawings.

FIGS. 1 to 16 show an automotive front grille according to a first embodiment of the invention; in which:

FIG. 1 shows a front view of the front grille;

FIG. 2 shows an enlarged cross-sectional view taken along the line 2—2 of FIG. 1;

FIG. 3(a) and (b) show schematically, as a development, the front view and the rear view of the front grille clarifying the plated portions;

FIG. 4 shows a partially enlarged front view of a main partition of the front grille;

FIG. 5 shows a cross-sectional view taken along the line 5—5 of FIG. 4;

FIG. 6 shows a partially enlarged rear view of a frame of the front grille;

FIG. 7 shows partially further enlarged cross-sectional view of the groove shown in FIG. 2;

FIG. 8 shows a partially enlarged cross-sectional view of a mold for forming the grille main body;

FIG. 9 shows a partial cross-sectional view of the grille main body on which a chemical plating is applied;

FIG. 10 shows a partial cross-sectional view of the grille main body further having an undercoat plating layer formed on the chemical plating layer;

FIG. 11 shows a partial cross-sectional view of the grille main body, from which the chemical plating formed at a to-be-unplated portion is removed by dissolution;

FIG. 12 shows a partial cross-sectional view of the grille main body having a general electroplating layer formed on the undercoat plating layer;

FIG. 13 shows a partial cross-sectional view of the grille main body, the plated portion of which is covered with an electroforming mask;

FIG. 14 shows a partial cross-sectional view of the grille main body on which a coating layer is formed on the unplated portions;

FIG. 15 shows a plot of the results of evaluation with respect to whether a partial plating can be achieved or not when grille bodies with varied groove width-to-groove depth ratios vs. the radius of curvature of the curve at the bottom of the groove; and FIG. 16 shows a plot of cumulative solved quantity of chemical plating layer in the respective steps in the electroplating step.

FIGS. 17 to 22 show an automotive front grille having a shape different from that of the first embodiment according to a second embodiment of the invention, in which:

FIG. 17 shows a front view of the front grille;

FIG. 18 shows a partial cross-sectional view of the portion around the wide groove taken along the line 18—18 of FIG. 17;

FIG. 19 shows a partial cross-sectional view of the grille main body on which a chemical plating is applied;

FIG. 20 shows a partial cross-sectional view of the grille main body having an electroplating layer formed on the chemical plating layer;

FIG. 21 shows a partial cross-sectional view of the grille main body, the plated portion of which is covered with an electroforming mask; and FIG. 22 shows a partial cross-sectional view of the grille main body on which a coating layer is formed.

FIGS. 23 to 25 show an outer cover for an automotive door mirror bracket according to a third embodiment of the invention; in which:

FIG. 23 shows a front view of the outer cover for a door mirror bracket;

FIG. 24 shows a cross-sectional view taken along the line 24—24 of FIG. 23; and

FIG. 25 shows a rear view of the outer cover for a door mirror bracket.

DETAILED DESCRIPTION OF THE PREFERRED EMBODIMENTS

A first embodiment of the present invention will be described below. The basic constitution of the resin product and that of the partial plating process therefor according to the present invention are described in the first embodiment. The second embodiment will be described in terms of its differences with the first embodiment.

First Embodiment

An automotive front grille 1 as the resin product according to a first embodiment of the present invention is described in reference to FIGS. 1 to 16.

Figure 1:
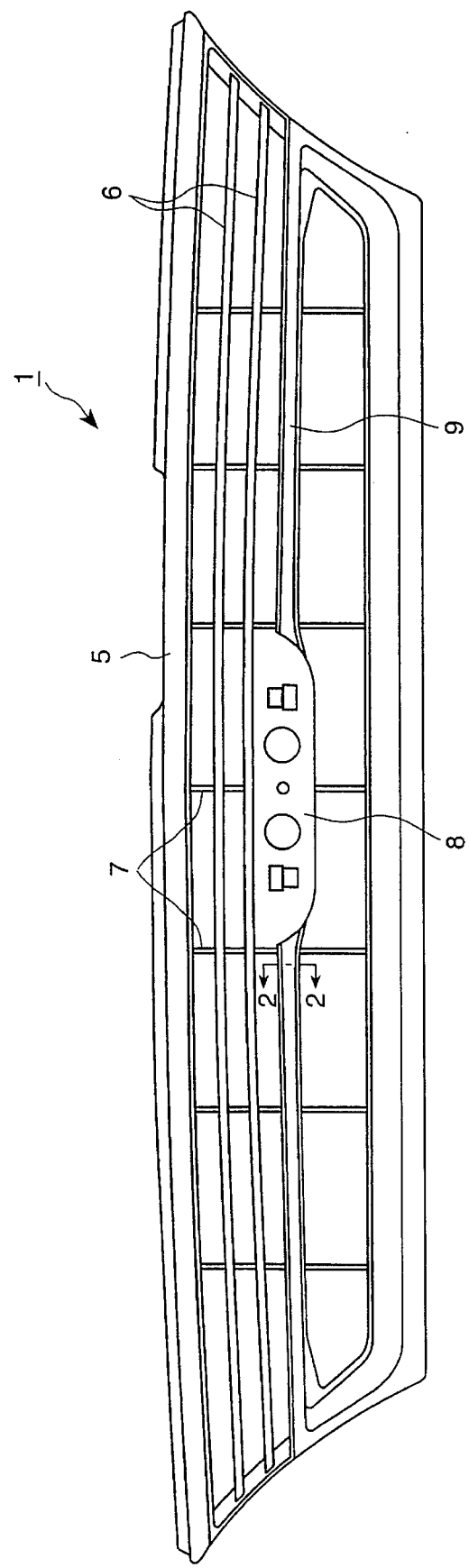

A front grille 1, as shown in FIG. 1, is attached to the front of an automobile. As shown in FIGS. 1 to 3(b), the front grille 1 is provided with a front grille main body (hereinafter referred to as grille body) 2 as an ABS (acrylonitrile-butadiene-styrene) resin base material. The front grille 1 has on the front surface a decorative plating layer 3 (netting in FIG. 3(a) and (b) on a portion of the surface and a coating layer 4 formed on the rest of the portions (except for some portions of the rear surface).

To describe more specifically, the front grille 1 has a substantially trapezoidal frame 5, in which a plurality of sub-partitions 6 extending horizontally are formed. A plurality of vertical connecting plates 7 are also formed in the frame 5. The front grille 1 has at the center thereof a fitting plate 8 for fitting thereon a mark plate (not shown), with a pair of main partitions 9 extending from the frame 5 toward the fitting plate 8. The plating layer 3 is formed mainly on the front surface of the frame 5 and also on the front surface of the main partitions 9. The coating layer 4 is formed mainly on the front surfaces of the sub-partitions 6, fitting plate 8 and connecting plates 7.

Figure 4:
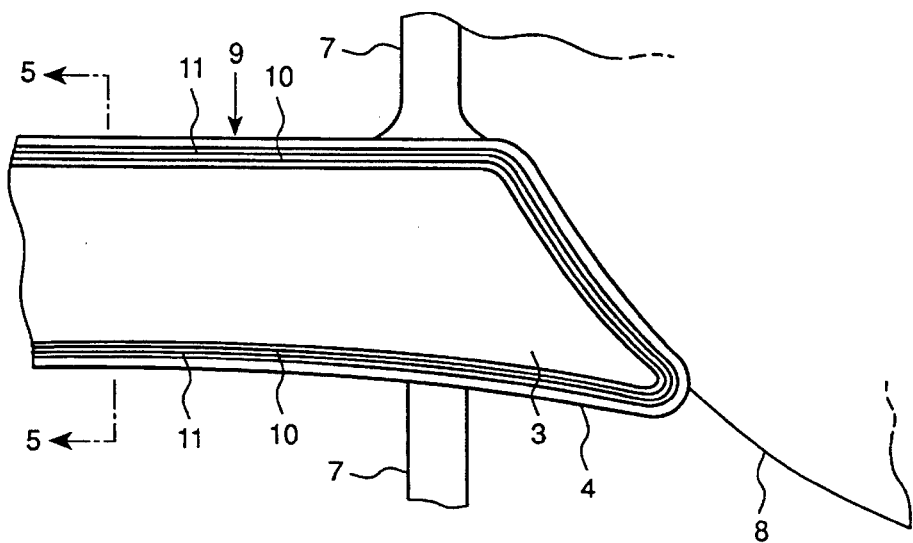
Figure 5:
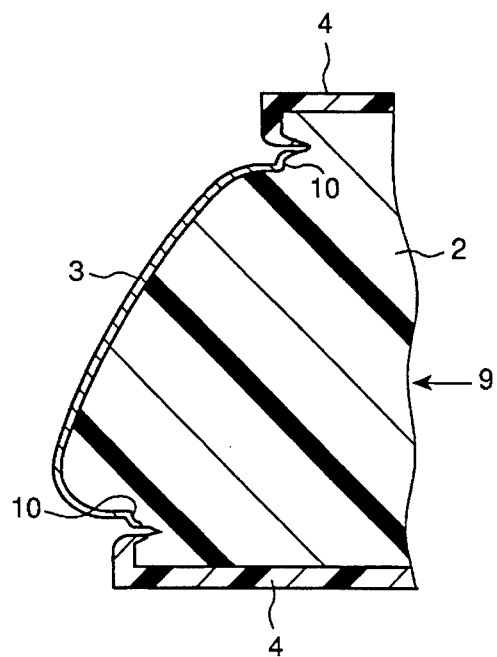

FIG. 4 shows a partially enlarged front view of the main partition 9 (the portion of FIG. 3); and FIG. 5 shows a cross-sectional view taken along the line 5—5 of FIG. 4. As shown in FIGS. 4 and 5, as well as, in FIG. 1, step sections 10 and grooves 11 having substantially V-shaped cross sections both locating on contour lines (or closed loops) are formed on the circumference of the frame 5 and main partitions 9 (see FIG. 3(a). The central part of each main partition 9 locating between the step sections 10 is bulged.

Figure 6:
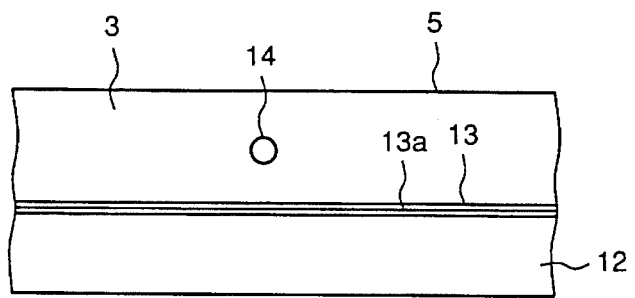

FIG. 6 shows a partially enlarged rear surface (the portion β of FIG. 3) of the frame 5. As shown in FIG. 6, contoured grooves 13 having substantially V-shaped cross sections are formed so as to define the boundaries between the decorative plating layer 3 and to-be-unplated portions 12 where no decorative plating layer 3 is formed on the rear surface of the grille body 2. A protrusion 14 serves as an electrode and protrudes backward from the rear surface of the grille body 1 and inward with respect to the contour lines (toward the rear of the automobile).

Figure 2:
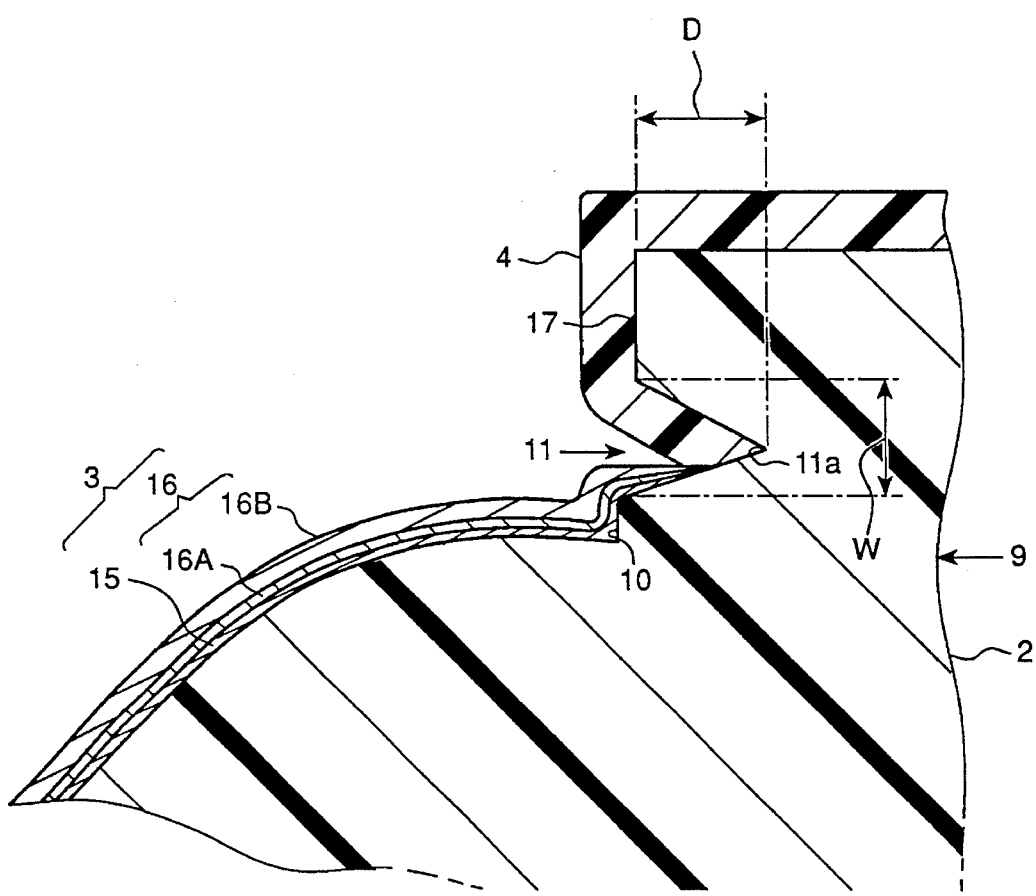

As shown in FIG. 2, the plating layer 3 includes a chemical plating layer 15 and an electroplating layer 16. In this embodiment, a copper layer having a thickness of about 0.3 to 0.4 μm is formed as the chemical plating layer 15. The electroplating layer 16 has a thickness of about 20 to 50 μm and includes a nickel undercoat plating layer as a first electroplating layer 16A and a general electroplating layer 16B as a second electroplating layer. More specifically, the general electroplating layer 16B is a composite plating layer having a copper plating layer as the lowermost layer, a semi-brilliant nickel plating layer, a brilliant nickel plating layer and a chrome plating layer formed upward in this order (these layers are not shown).

Figure 7:
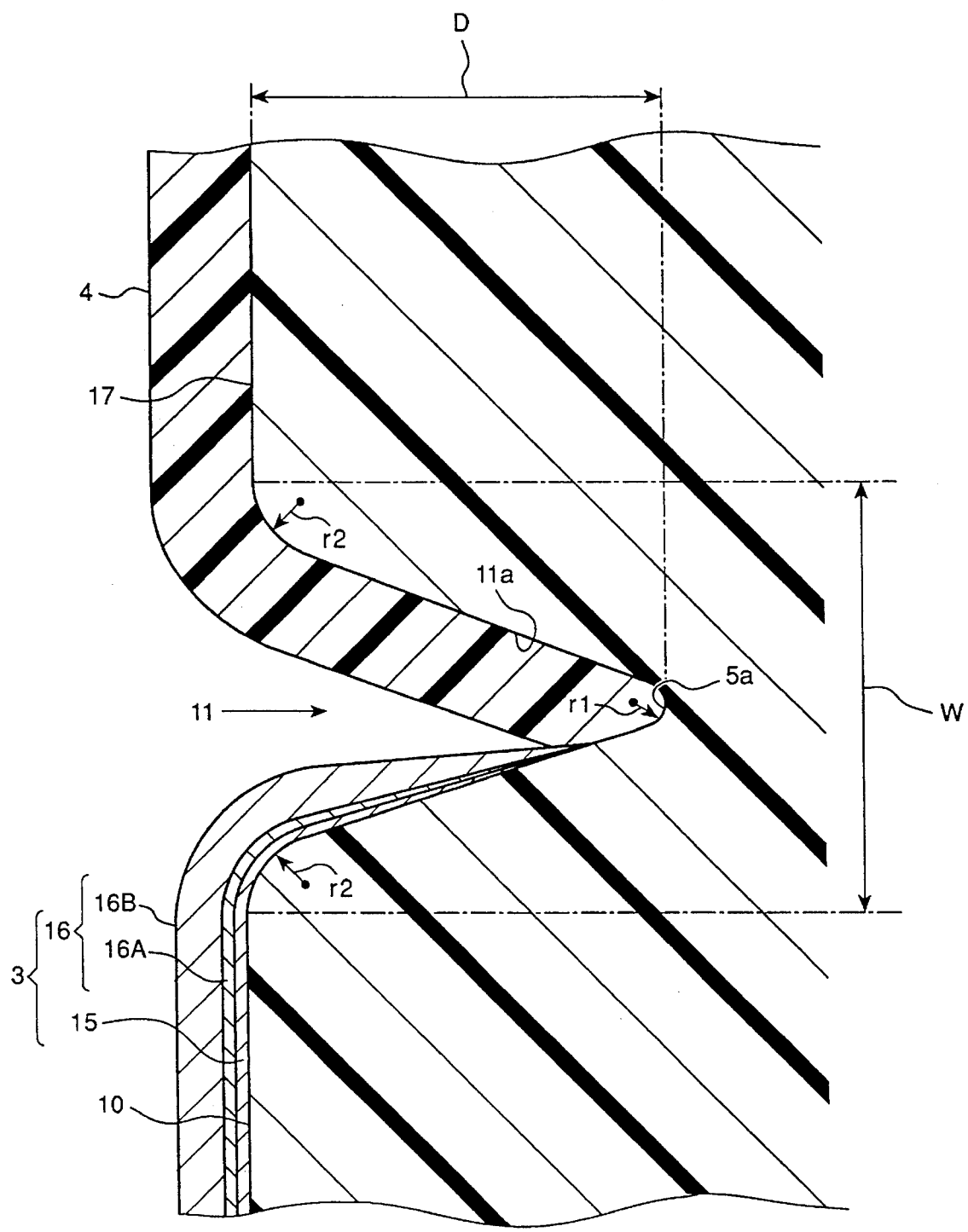

As shown in FIG. 7, the bottoms 11a, 13a (not shown) of the grooves 11,13 (not shown in FIG. 7) are both microscopically curved (only the groove 11 is shown in FIG. 7) for convenience's sake in molding. In this embodiment, the radius of curvature r1 in the profile of the bottom 11a (13a) is, for example, less than 0.1 mm.

With respect to the size of the grooves 11,13, for example, they preferably have a width W of 0.5 mm and a depth D of 0.7 mm. While the width W may not particularly be limited, it is preferably not less than 0.3 mm due to the limitations of working and not more than 1.0 mm so as to achieve improvement in design. While the depth D may not particularly be limited, it is preferably not less than 0.3 mm likewise from the limitations of working. Further, in this embodiment, the depth D to width W ratio (D/W) and the radius of curative r1 satisfy the following equations:

$$D/W > 6.7 \times r1 + 1.0 \quad (1)$$

$$D/W > 180 \times r1 - 15.7 \quad (2)$$

Where r1 as it appears in the formula above relates to the magnitude of the radius of curvature (See FIG. 15) and as such equals $$= \frac{r1 \text{ mm}}{1 \text{ mm}}.$$

While the upper limit of ratio (D/W) may not be particularly limited, it is preferably 5.0 or less, more preferably 4.0 or less, in view of ease of manufacture. If the ratio (D/W) is 3.0 or less, the manufacturing operation is even more easily performed.

Besides, the cross section at the edge formed by the outer wall of the groove 11(13) and a contoured rail 17 located on the front surface of the grille body 2 outside the outer wall is also microscopically curved. Further, the cross section at the edge formed by the inner wall of the groove 11(13) and the surface step 10 located inside the inner wall on the front surface of the grille body 2 is also microscopically curved. To describe in more detail, the radius of curvature r2 of the profile at such edge is not less than 0.2 mm (0.3 mm in this embodiment), and thus the edges are rounded. The grooves 11,13 can be formed integrally with the grille body 2, when it is molded in a mold 21.

Moreover, the total of the width of the surface step 10, the width W of the groove 11 and width of the rail 17 is not less than 1.5 mm. This is the minimum value necessary for forming the groove 11 in the mold in the mold preparation.

Figure 14:
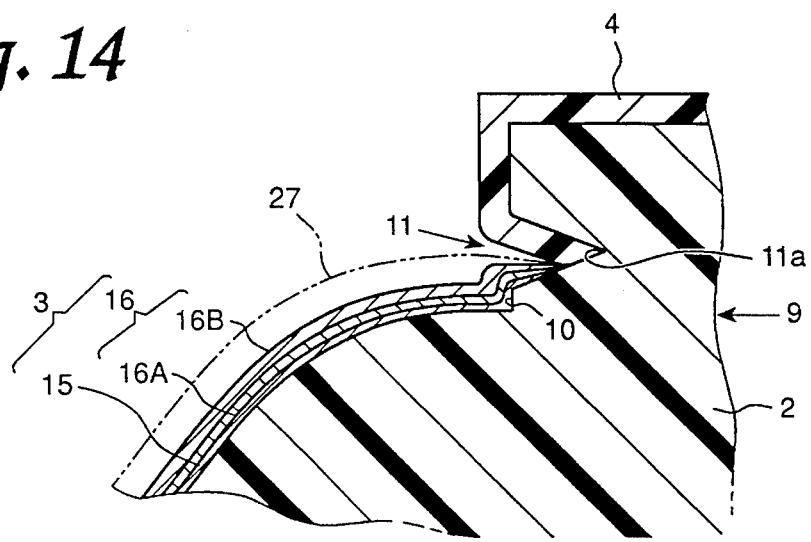

As shown in FIG. 2, the width of the surface step 10 is relatively small, and the groove 11 is positioned such that, when the grille body 2 is covered with an electroforming mask 27 (see FIG. 14), at least the plating layer 3 formed on the front surface may entirely be covered therewith (the lower part in FIG. 14). Accordingly, when the plating layer 3 is covered by the electroforming mask 27 prior to coating, the plating layer 3 never fails to be concealed by the electroforming mask 27.

Figure 8:
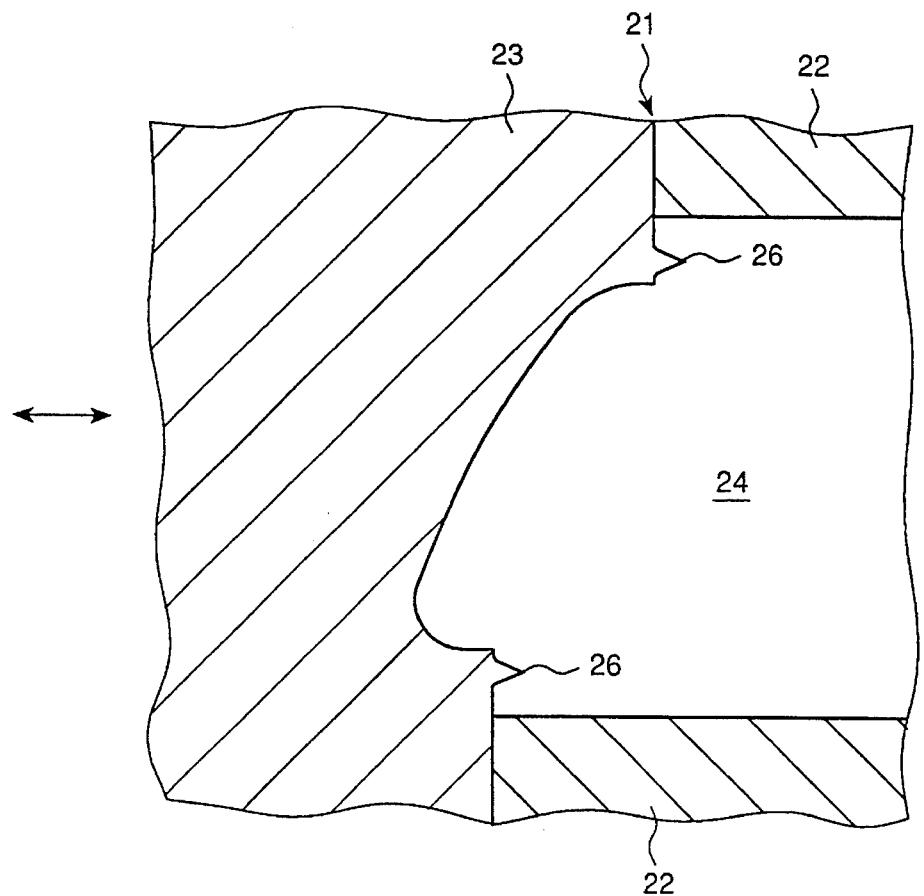

Next, the mold 21 for forming the grille body 2 will be described. As shown in FIG. 8, the mold 21 is provided with a fixed die 22 and a movable die 23. These two dies 22,23 together define a cavity 24 for forming the grille body 2. It should be noted that ridges 26 for forming the grooves 11, 13 are formed integrally with the movable die 23 (or fixed die 22).

Various plating solutions to be used for forming the chemical plating layer 15 and the electroplating layer 16 will now be described. First, the plating solution for forming the chemical plating layer 15 contains 5 g/L of copper sulfate pentahydrate, 5 g/L of sodium hydroxide, 10 mL/L of formalin in (37% by volume) and 25 g/L of a Rochelle salt; and the plating solution for forming the undermost undercoat plating layer 16A in the electroplating layer 16 contains 250 g/L of nickel sulfate, 30 g/L of nickel chloride and 30 g/L of boric acid.

The plating solution for forming the copper plating layer in the general electroplating layer 16B contains 200 g/L of copper sulfate, 50 g/L of sulfuric acid, 0.01 g/L of hydrochloric acid and a trace of brightening agent. The plating solution for forming the semi-brilliant nickel plating layer contains 280 g/L of nickel sulfate, 45 g/L of nickel chloride, 40 g/L of boric acid and a trace of brightening agent. Further, the plating solution for forming the brilliant nickel plating layer contains 240 g/L of nickel sulfate, 45 g/L of nickel chloride, 30 g/L of boric acid, a trace of brightening agent and additives. The plating solution for forming the chrome plating layer contains 250 g/L of chromic anhydride, 10 g/L of sodium silicofluoride and 1 g/L of sulfuric acid.

Further, in the present embodiment, a predetermined solution for dissolving the chemical plating layer 15 formed at the portions where no decorative plating is required at the step after the undercoat plating layer 16A is prepared. This solution is a 10% aqueous ammonia and has a liquid temperature of 50 C.

Next, the process for producing the front grille 1 will be described in detail.

An ABS resin melt is first injected to fill the cavity 24 according to known molding method (see FIG. 8). After the resin is cooled and solidified, the dies 22,23 are let Open to remove the grille body 2. In this process, the dies 22,23 are let open in a direction such that the ridges 26 etc. can be withdrawn from the grille body 2, so that the ridges 26 do not interfere with the mold opening to allow smooth releasing of the grille body 2. Thus, a grille body 2 having contoured grooves 11, 13 at predetermined sites can be obtained.

Figure 9:
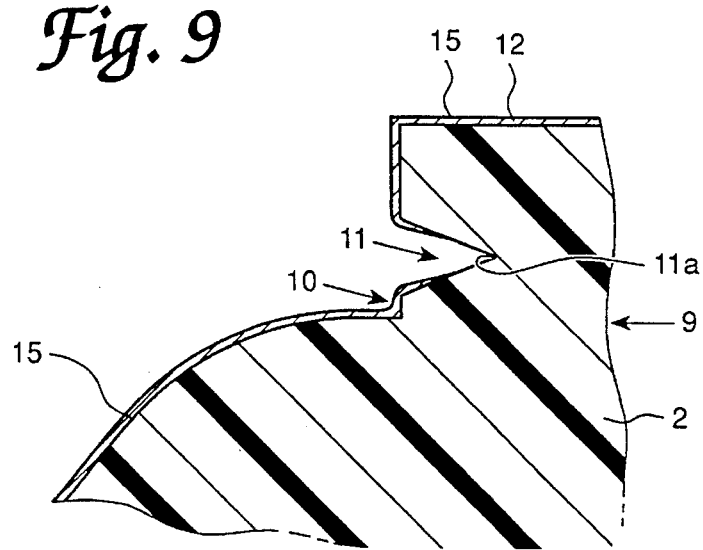

Subsequently, the thus obtained grille body 2 is immersed in a chemical plating solution to carry out chemical plating. In this process, the bottoms 11a, 13a of the grooves 11, 13 are too narrow, as shown in FIG. 9, to allow the plating solution to intrude thereto. In FIGS. 9 to 12, while only the groove 11 on the front side is shown for convenience sake, the same will apply to the groove 13 on the rear surface. Accordingly, chemical plating is not substantially applied to these bottoms 11a,13a, and the chemical plating layer 15 can be formed on the entire surface of the grille body 2 except for the bottoms 11a, 13a.

Figure 10:
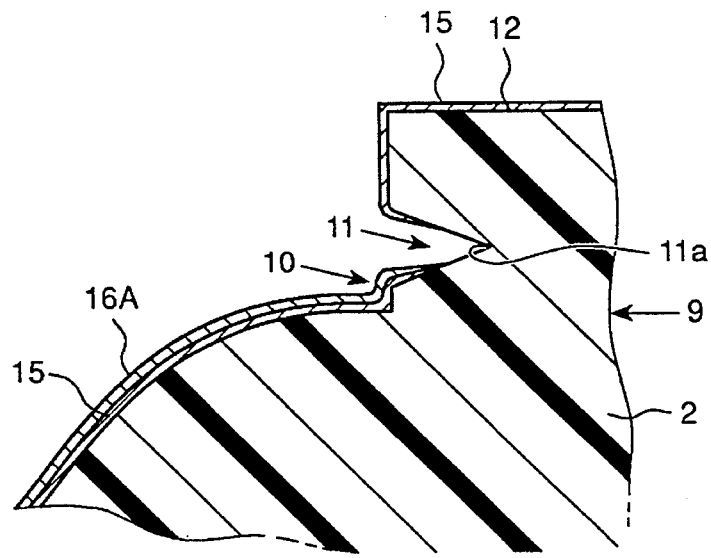

Next, in the undercoat plating step as the first electroplating step, the grille body 2 having the chemical plating layer 15 formed thereon is immersed in a plating solution for forming an undercoat plating layer 16A for a predetermined time. The to-be-plated portions surrounded by the grooves 11(13) are electrically charged utilizing the protrusion 14 formed on the rear surface of the grille body 2 as an electrode. Thus, as shown in FIG. 10, no plating layer is formed on the to-be-unplated portions 12, since these portions are electrically insulated by the grooves 11(13). On the other hand, a relatively thin undercoat plating layer 16A is formed on the to-be-plated portions having already the chemical plating layer 15 formed thereon.

Figure 11:
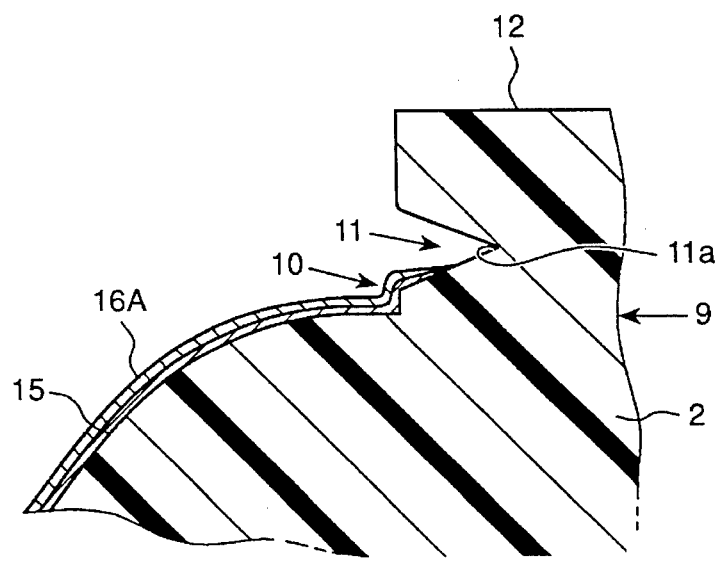
Figure 12:
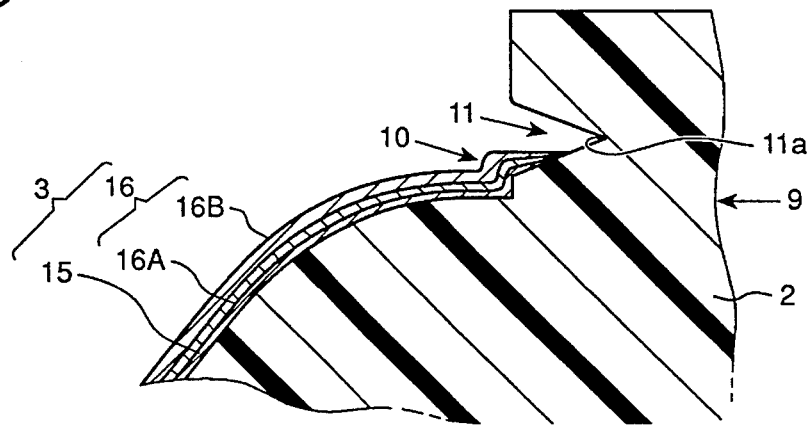

In the subsequent step of dissolving the chemical plating layer, the grille body 2 having the undercoat plating layer 16A formed thereon is immersed in a predetermined solution for about 5 minutes. In this step, the portions on which the undercoat plating layer 16A is formed are not dissolved by an alkaline aqueous ammonia solution, since the layer 16A is formed of nickel. Since copper is utilized for the chemical plating layer 15 formed on the to-be-unplated portions, the layer 15 is dissolved by the alkaline aqueous ammonia solution. Thus, as shown in FIG. 11, the chemical plating layer 15 formed on the to-be-plated portions and the undercoat plating layer 16A formed thereon remain on the surface of the grille body 2.

The chemical plating layer 15 is not present at the other portions than the portions where the undercoat plating layer 16A is formed. Accordingly, no plating layer except for the undercoat plating layer 16A is exposed on the grille body 2.

Subsequently, in the second electroplating step (including the copper plating step, semi-brilliant nickel plating step, brilliant nickel plating step and chrome plating step), the procedures in the first electroplating step are repeated substantially analogously. It should be noted that the chemical plating layer 15 formed on the to-be-unplated portions has already been dissolved in a predetermined solution and is no more present on the grille body 2, so that it never happens that the chemical plating layer 15 is dissolved in the respective plating solutions in the second electroplating step after the copper plating step to contaminate them.

Since no chemical plating layer 15, which serves as a kind of electrode, is exposed on the to-be-unplated portions 12, no general plating layer 16B will be formed on such portions. Accordingly, formation of any plating layer 3 on the to-be-unplated portions or short-circuiting between the grooves 11,13 can be prevented.

A multi-layered general electroplating layer 16B can be formed on the undercoat plating layer 16A by application of the second electroplating step including the steps as described above. Thus, the plating layer 3 having the chemical plating layer 15 and the electroplating layer 16 is formed on the to-be-plated portions only.

Figure 13:
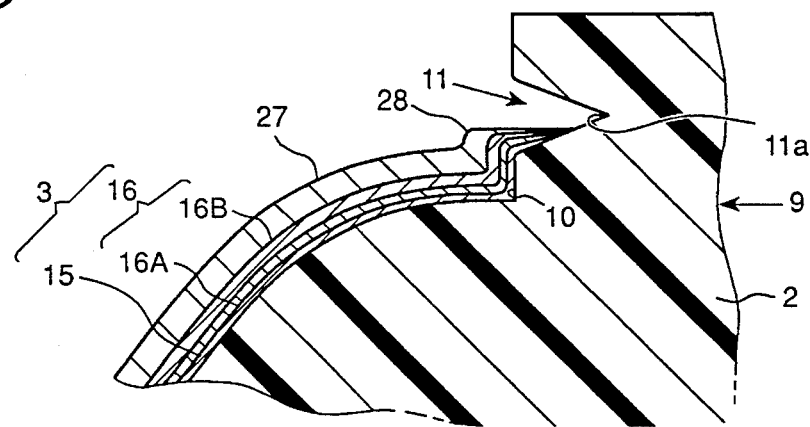

Subsequently, the portions on which the plating layer 3 is formed are covered with the electroforming mask 27, as shown in FIG. 13. The electroforming mask 27 is made of a metal plate having a thickness of several millimeters and a profile conforming to that of the front grille 1. Openings 28, which open at the portions where a coating layer 4 is to be formed, are suitably defined in the electroforming mask 27. When the electroforming mask 27 is applied to the grille body 2, the portions where coating layer 4 is to be formed are exposed through the openings 28. Then, as shown in FIG. 14, the exposed portions are subjected to spray coating to form the coating layer 4.

Next, the electroforming mask 27 is removed from the grille body 2 to obtain the front grille 1 shown in FIG. 1. The front grille 1, as mentioned above, has the plating layer 3 mainly on the front surface of the frame 5, as well as, the front surface of the main partition 9, while the coating layer 4 mainly on the front surfaces of the sub-partitions 6, of the fitting plate 8 and of the connecting plates 7.

As described above, no chemical plating layer 15 is formed at the bottoms 11a, 13a of the grooves 11,13 according to this embodiment, so that only the portions where decorative plating layer should be formed are electrically charged when the electroplating layer 16 is to be formed. Accordingly, the chemical plating layer 15 formed on the to-be-unplated portions 12 is dissolved by a predetermined solution. On the to-be-plated portions, the multi-layered electroplating layer 16 is formed on the surface of the chemical plating layer 15. Thus, a grille body 2 having the plating layer 3 formed securely on the to-be-plated portions can be obtained. On the other hand in the prior art process, when a coating layer is to be formed on the plating layer formed on the entire surface of the grille body, in a primer must preliminarily be applied to the to-be-coated portions of the plating layer. However, this invention does not require the use of a primer, and the coating layer 4 can be formed directly on the grille body 2.

As the result, the number of working steps and the cost are reduced. Further, the electroplating layer 16 need not be formed on all of the grille body 2, which also contributes to the cost reduction.

Since neither the plating layer 3 nor the primer layer is present at the portions where the coating layer 4 is formed directly on the grille body 2, so that the thickness of the coating layer 4 can be reduced. This leads to excellent appearance of the resulting product. Further, since the coating layer 4 and the grille body 2 are both made of resin materials, and since the electroforming mask 27 does not expose the plating layer 3, when the coating layer 4 is to be formed, the coating layer 4 can firmly be adhered onto the grille body 2 even if a general-purpose coating material is used. Accordingly, the coating layer may not flake, and the durability of the coated portions can be improved.

In this embodiment, the step sections 10, more precisely the grooves 11, demarcate the boundaries between the coating layer 4 and the plating layer 3. Accordingly, when the grille body 2 is to be covered with the relatively thick electroforming mask 27, it can be positioned on the grille body 2 in such a way that the edges of the electro-forming mask 27 may accurately and easily be registered with the edges of the plating layer 3 resorting to step sections 10. Thus, the boundaries between the coating layer 4 can be clearly defined, when the coating layer 4 is formed, further improving the appearance of the resulting product.

In order to examine the influence by the shape of the grooves 11,13 when the plating layer 3 is formed, the following test was carried out to evaluate whether the plating layer 3 can securely be formed only on the to-be-plated portions, while varying the radius of curvature r1 and the ratio of the depth D to the width W (D/W) at the cross-sectional curves of the bottoms 11a,13a of the grooves 11, 13. The result is as follows.

Figure 15:
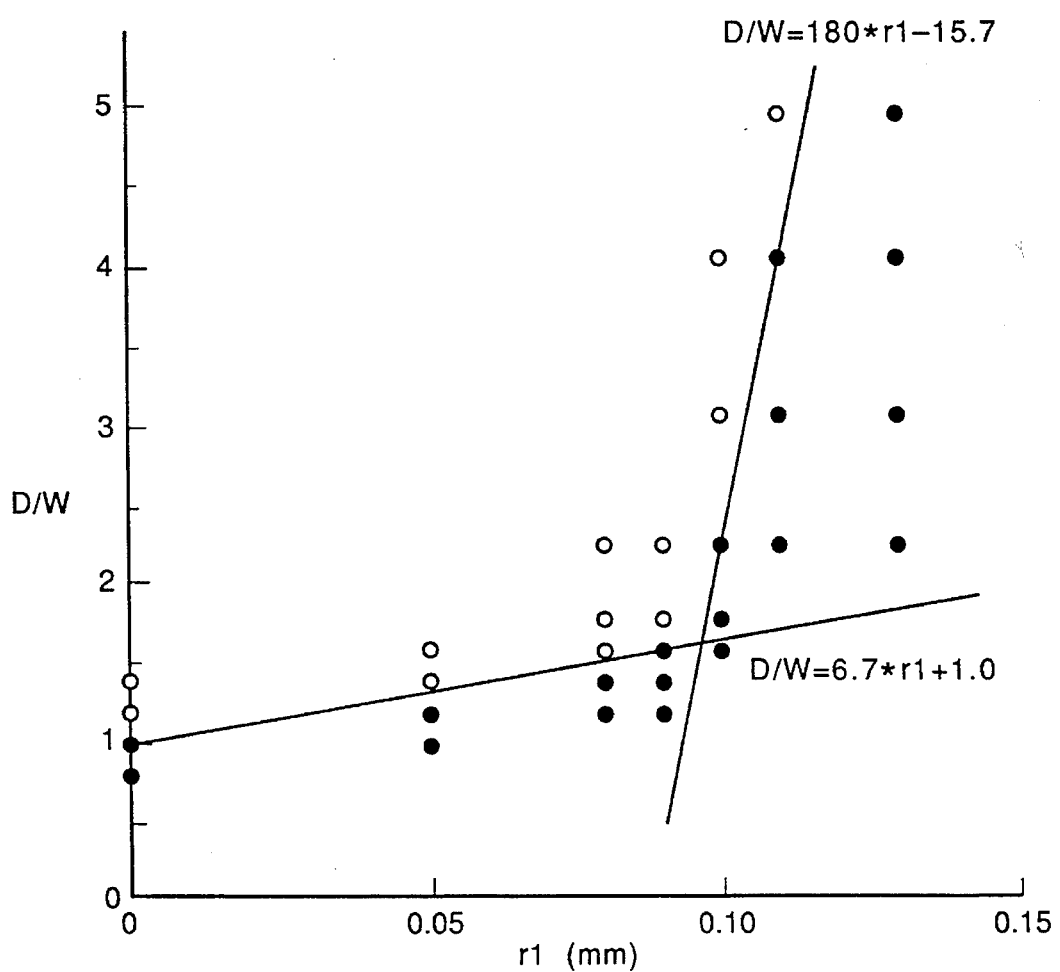

Grille bodies 2 were molded with varied radius of curvature r1 and the ratio of the depth D to the width (D/W) at the curves of the bottoms 11a,13a of the grooves 11,13. In order to evaluate the possibility of partial plating of the grille bodies 2, FIG. 15 was plotted based on the above two parameters. In FIG. 15, the open circles mean that the plating layer 3 was formed securely on the to-be-plated portions only; whereas the closed circles show that the plating layer 3 failed to be formed on the to-be-plated portions only. The failure is attributable to the formation of the chemical plating layer 15 at the bottoms 11a,13a of the grooves 11,13 or to the formation of the chemical plating layer 15 on each side of the grooves and across these grooves.

As shown in FIG. 15, in those cases which satisfy the two requirements (D/W>180×r1−15.7 and D/W>6.7×r1+1.0), the plating layers 3 were securely formed on the to-be-plated portions only. In those cases which failed to satisfy one of the requirements, the plating layer 3 failed to be formed on the to-be-plated portions only.

So long as the requirements for the groove formation are satisfied, the profile of the bottom of each groove need not strictly be formed acute. Accordingly, the ridges 26 of the mold 21 for forming the bottoms 11a, 13a can be worked with no difficulty. If the ridges 26 are formed strictly acute, durability of the ridges 26 is lowered, leading readily to chipping. However, in this embodiment, there is no such disadvantage. Thus, the difficulties in molding the grille body 2 having such shape of grooves 11, 13 can be minimized, and the production cost elevation can be controlled.

The following effects can be given as the additional effects in this embodiment. Namely, since the radius of curvature r2 at the boundary between the groove 11(13) and the grille body 2 is not less than 0.2 mm, it never happens that the electroplating layer 16 concentrates and deposits along the boundary and that the electroplating layer 16 is formed to spread at such portions. Thus, the effect that the partial plating can securely be achieved on the to-be-plated portions only can further be enhanced.

The phenomenon that the electroplating layer is formed to spread like a flower which is liable to be caused when the boundary between the groove 11(13) and the grille body 2 is edged does not occur in the present embodiment, and the edges of the plating layer 3 can more clearly be defined.

In the above embodiment, the chemical plating layer 15 is made of copper. However, the layer 15 may be made of nickel. In this case, the chemical plating layer 15 can be dissolved simultaneously with the formation of the undercoat plating layer 16A in the undercoating plating step, and thus no extra step for dissolving the chemical plating layer 15 is necessary.

The process for producing the front grille 1 according to such embodiment will be described below briefly.

A plating solution for forming the undercoat plating layer is first prepared. This solution has a liquid temperature of 55 C and contains 250 g/L of nickel sulfate, 170 g/L of nickel chloride, 4 g/L of hydrochloric acid and 40 g/L of boric acid. The hydrogen ion exponent (hereinafter referred to as pH) of the thus prepared solution is 1.5 in this embodiment. The plating solution preferably has a pH of not higher than "4".

The chemical plating layer 15 is formed on the entire surface of the grille body 2 except for the bottoms 11a, 13a.

The grille body 2 having the chemical plating layer 15 formed thereon is then subjected to the electroplating step including the undercoat plating step, copper plating step, semi-brilliant nickel plating step, brilliant nickel plating step and chrome plating step. First, in the undercoat plating step, the grille body 2 having the chemical plating layer 15 formed thereon is immersed in an undercoat plating solution for a predetermined time. The to-be-plated portions are electrically charged. Then, the chemical plating layer 15 formed on the to-be-unplated portions is dissolved by the undercoat plating solution, because the solution has a high acidity (pH=1.5) sufficient to dissolve readily the chemical plating layer present on the uncharged portions. On the other hand, a relatively thin undercoat plating layer 16A is formed on the surface of the chemical plating layer 15 present on the to-be-plated portions.

In the subsequent copper plating step, semi-brilliant nickel plating step, brilliant nickel plating step and chrome plating step, the above procedures are repeated analogously. It should be noted that the chemical plating layer 15 formed on the to-be-unplated portions has already been dissolved in the plating solution for forming the undercoat plating layer 16A, while the undercoat plating layer 16A is formed on the surface of the chemical plating layer 15 present on the to-be-plated portions. Accordingly, the chemical plating layer 15 is not exposed in the respective steps after the copper plating step, so that it never happens that the chemical plating layer 15 is dissolved in the plating solutions of the respective steps after the copper plating step. This prevents contamination of these plating solutions.

Figure 16:
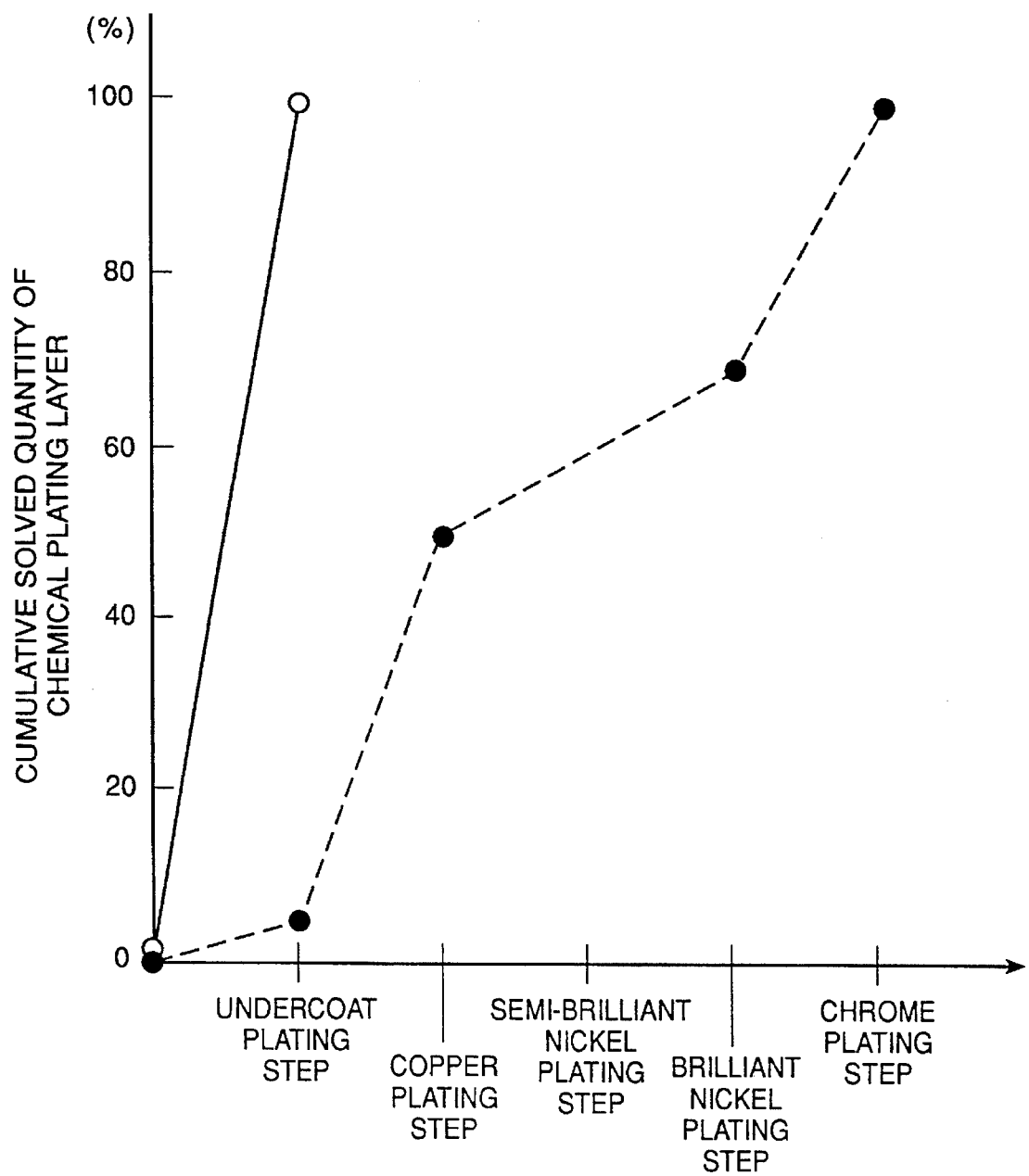

FIG. 16 shows a plot of cumulative solved quantity of the chemical plating layer 15 in the plating solutions of the respective steps in the electroplating step according to the present embodiment (solid line) and to a comparative embodiment (broken line). In the comparative embodiment, the step of dissolving the chemical plating layer 15 is not included in the chemical plating step etc. As shown in FIG. 16, the chemical plating layer dissolves gradually in the plating solutions of the respective plating steps in the comparative embodiment. In contrast, in the present embodiment, the chemical plating layer 15 is dissolved entirely in the plating solution of the undercoat plating step. Accordingly there is no dissolution of the chemical plating layer 15 thereafter. Accordingly, contamination of the subsequent plating solution can be prevented. This avoids the need to replace plating solutions which contribute to cost reduction. Further, no extra solution for dissolving the chemical plating layer, as described above, need not be used.

Second Embodiment

An automotive front grille 31 as the resin product according to a second embodiment of the present invention will be described referring to FIGS. 17 to 22. It should be noted that the major part of the present invention is substantially the same as in the first embodiment, so that the differences will mainly be described.

Figure 17:
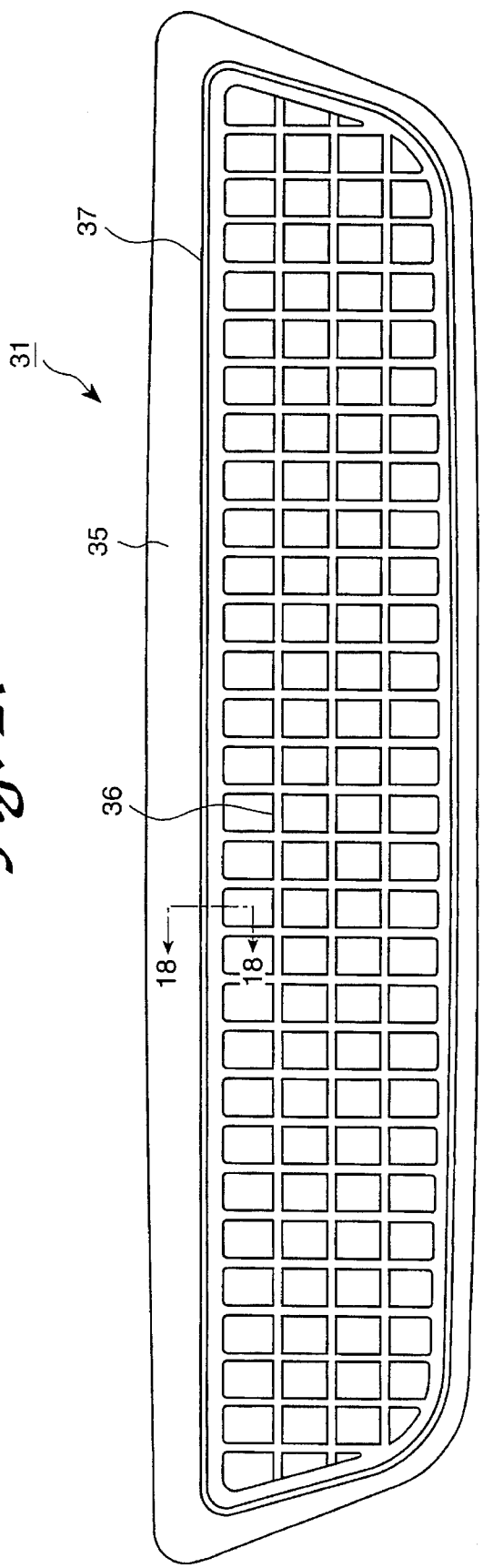
Figure 18:
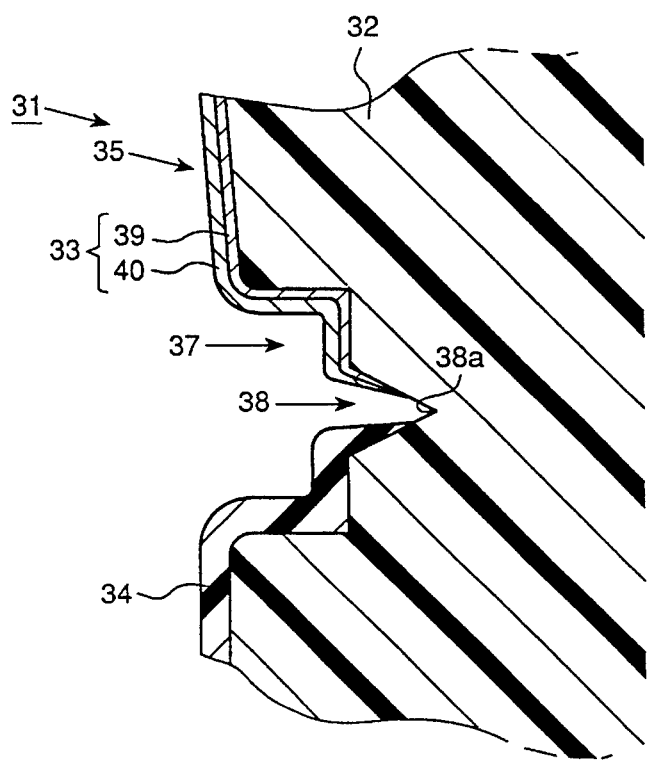

As shown in FIGS. 17 and 18, a front grille 31 is provided with a grille body 32 as the base material and has a decorative plating layer 33, and a coating layer 34 formed on the rest of the portions (except for some portions on the rear surface) like in the first embodiment. The great difference between this embodiment and the first embodiment is the shape of the front grille 31. The front grille 31 has a substantially trapezoidal frame 35 and a grid-like partition 36. A contoured wide groove 37 having a substantially U-shaped cross section is formed along the frame 35, with a plating layer 33 and a coating layer 34 being formed at the portion outer than the wide groove 37 of the frame 35 and at the portion inner than the wide groove 37 (for example, partition 36), respectively.

A contoured groove 38 having a substantially V-shaped cross section (see FIG. 18) is formed along and within the wide groove 37. Another contoured groove (not shown) having a substantially V-shaped cross section is also formed on the rear surface of the grille body 32 along the boundary between the portion having the plating layer 33 and the unplated portion. Further, a protrusion serving as an electrode (not shown) protrudes from the rear surface of the grille body 32.

As shown in FIG. 18, the plating layer 33 in this embodiment also includes a chemical plating layer 39 and an electroplating layer 40. These layers have the same composition as described in the above first embodiment. The groove 38 is located at a site such that, when an electroforming mask 41 is applied on the grille body 31 (the upper part in FIG. 18), the plating layer 33 present at least on the front surface may entirely be covered with the electroforming mask 41 to be described later (see FIG. 21). Accordingly, when the plating layer 33 is covered with the electroforming mask 41 so as to carry out coating, the plating layer 33 can completely be concealed by the electroforming mask 41.

Next, the process for producing the front grille 31 will be described.

Figure 19:
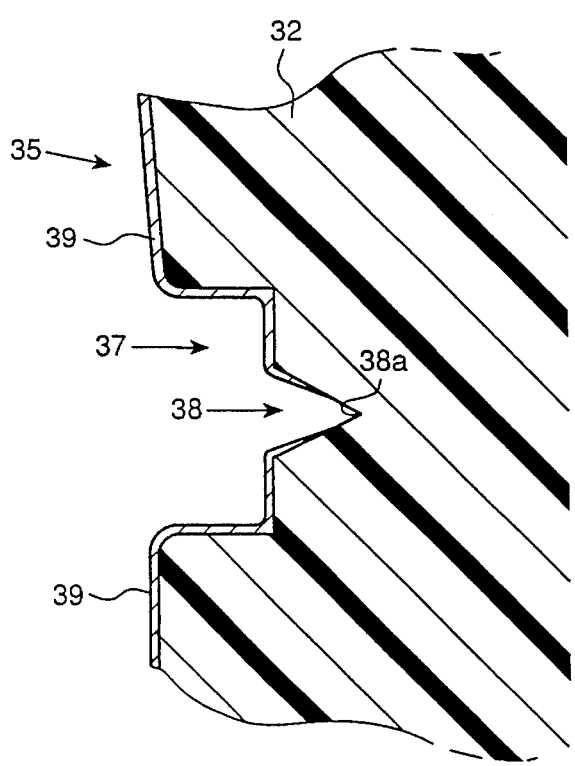

A grille body 32 having a groove 38 (including the groove on the rear surface) at a predetermined site is formed by known molding method. Subsequently, the grille body 32 is immersed in a chemical plating solution to form a chemical plating layer. In this process, no plating is applied to the bottom 38a, since the groove 38 is narrow, but a chemical plating layer 39 can be formed on the rest of the portions, as shown in FIG. 19.

Figure 20:
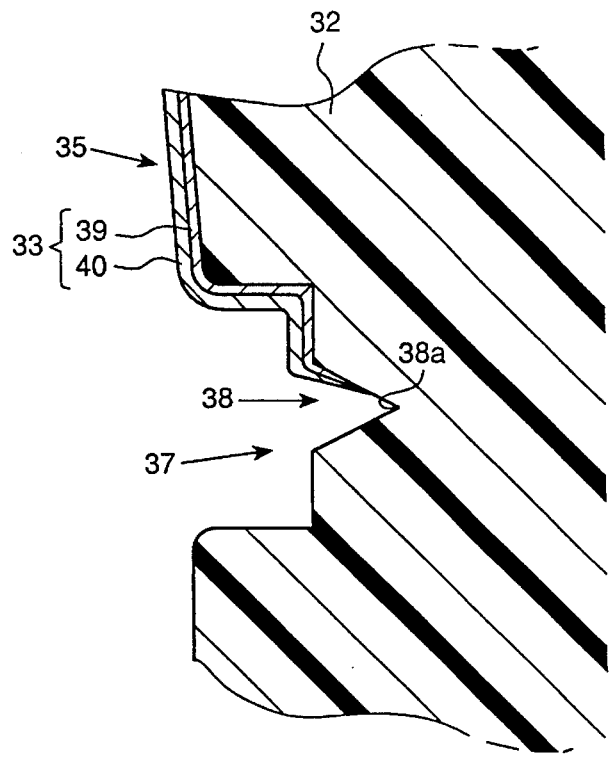

As shown in FIG. 20, the grille body 32 having the chemical plating layer 39 formed thereon is subjected to the electroplating step consisting of a plurality of steps. It should be noted that the dissolving step is included in the electroplating step. Thus, the chemical plating layer 39 formed on the to-be-unplated portions is dissolved by a predetermined solution, while a multi-layered electroplating layer 40 is formed on the surface of the chemical plating layer 39 present on the to-be-plated portions to obtain the plating layer 33 (the upper part in FIG. 20).

Figure 21:
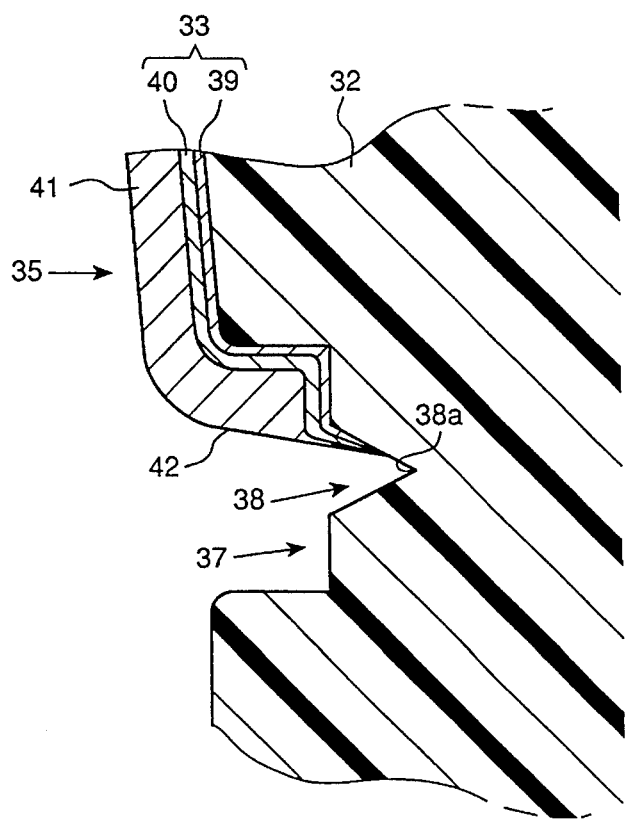

Subsequently, as shown in FIG. 21, the portions on which the plating layer 33 is formed are covered with an electroforming mask 41. Accordingly, the portions on which the coating layer 34 is to be formed are exposed through the opening 42 of the electroforming mask 41 (the lower part in FIG. 21).

Figure 22:
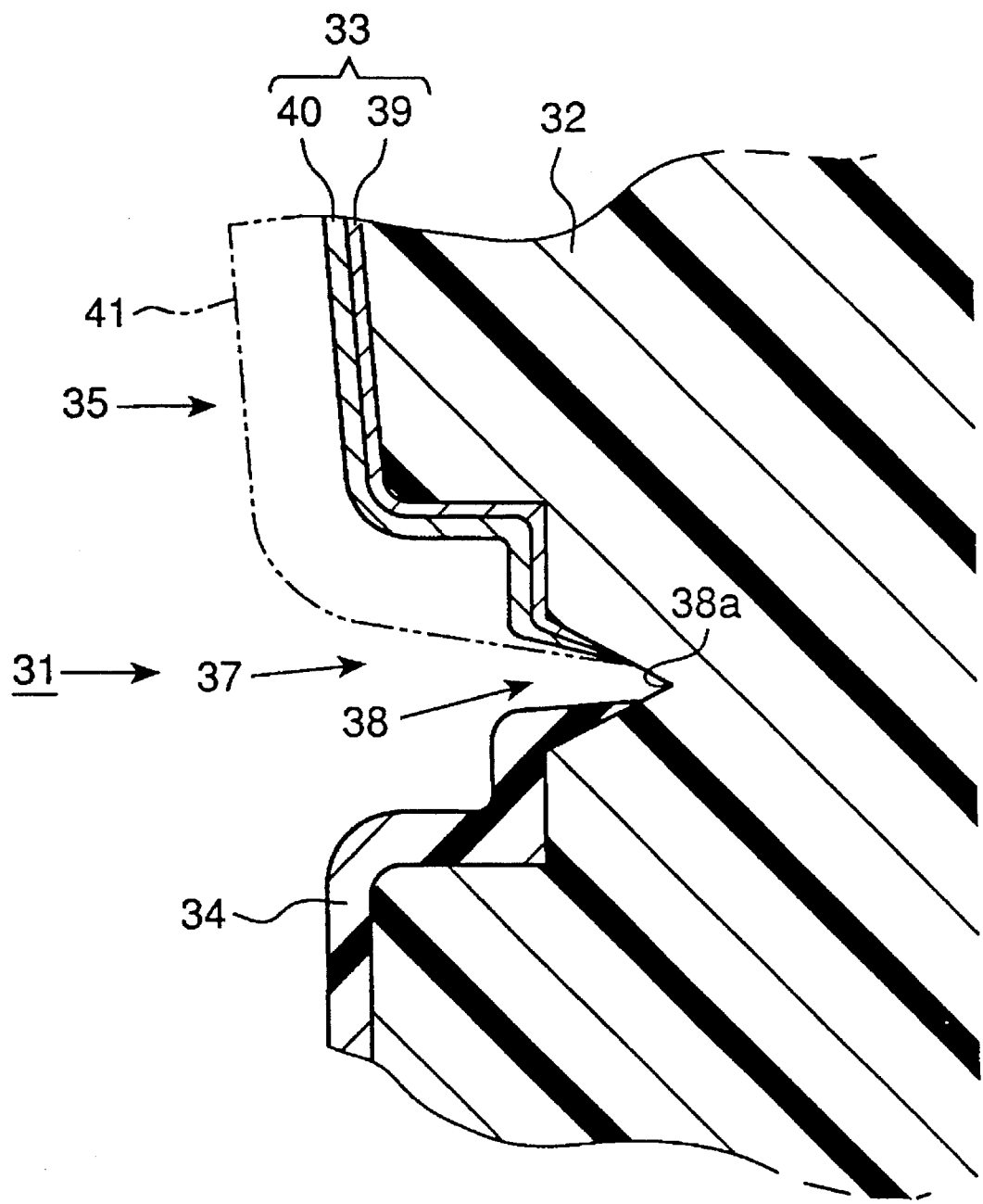

In this state, the plating layer 33 is completely concealed by the electroforming mask 41. As shown in FIG. 22, the portions which are not covered with the electroforming mask 41 are coated with a coating material by means of spraying to form a coating layer 34 at to-be-coated portions, while no coating layer 34 is formed on the portions covered with the electroforming mask 41.

After the coating layer 34 is formed, the electroforming mask 41 is removed to provide the front grille 31 shown in FIGS. 17 and 18.

While this embodiment 18 different from the first embodiment in that the step sections 10 are replaced by the wide groove 37, this embodiment exhibits almost the same effects as in the first embodiment.

Third Embodiment

An outer cover 51 for automotive door mirror bracket as the resin product according to a third embodiment of the present invention will be described referring to FIGS. 23 to 25. It should be noted that the major part of the present embodiment is substantially the same as in the first embodiment, so that the differences will mainly be described.

It is of common practice to attach door mirrors via door mirror brackets at the front side of the doors of vehicles such as automobiles. However, some users prefer to use conventional fender mirrors rather than the door mirrors. In the latter case, outer covers 51, as shown in FIG. 23, are applied so as to cover the fitting sections of the door mirror brackets.

The outer cover 51 has a substantially triangular plan view. The outer cover 51 is provided with an outer cover body 52 (see FIG. 24) made of an ABS resin as the base material. The outer cover 51 has a decorative plating layer 53 partly formed on the front surface and the rear surface and a coating layer 54 formed on the remaining portion.

Figure 23:
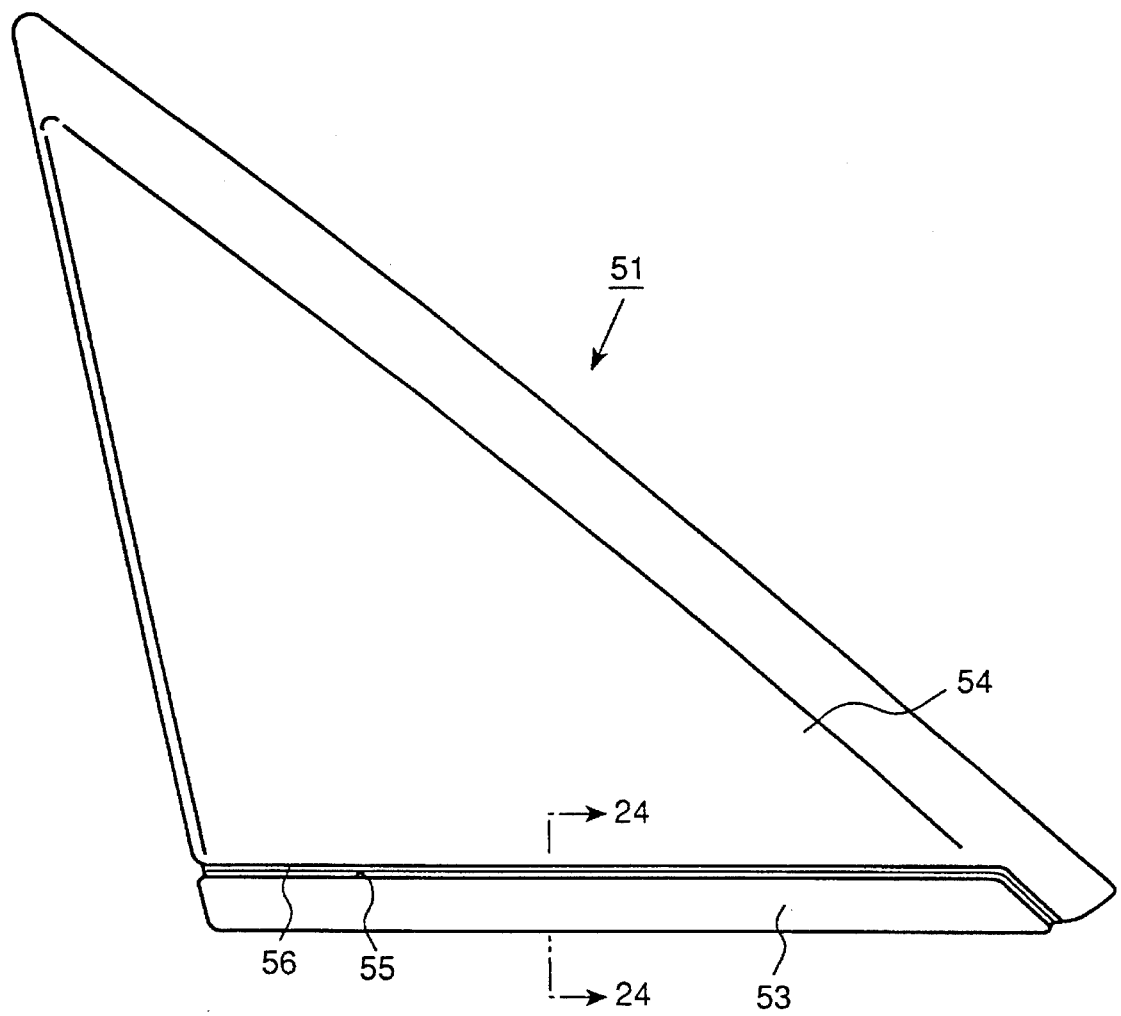
Figure 25:
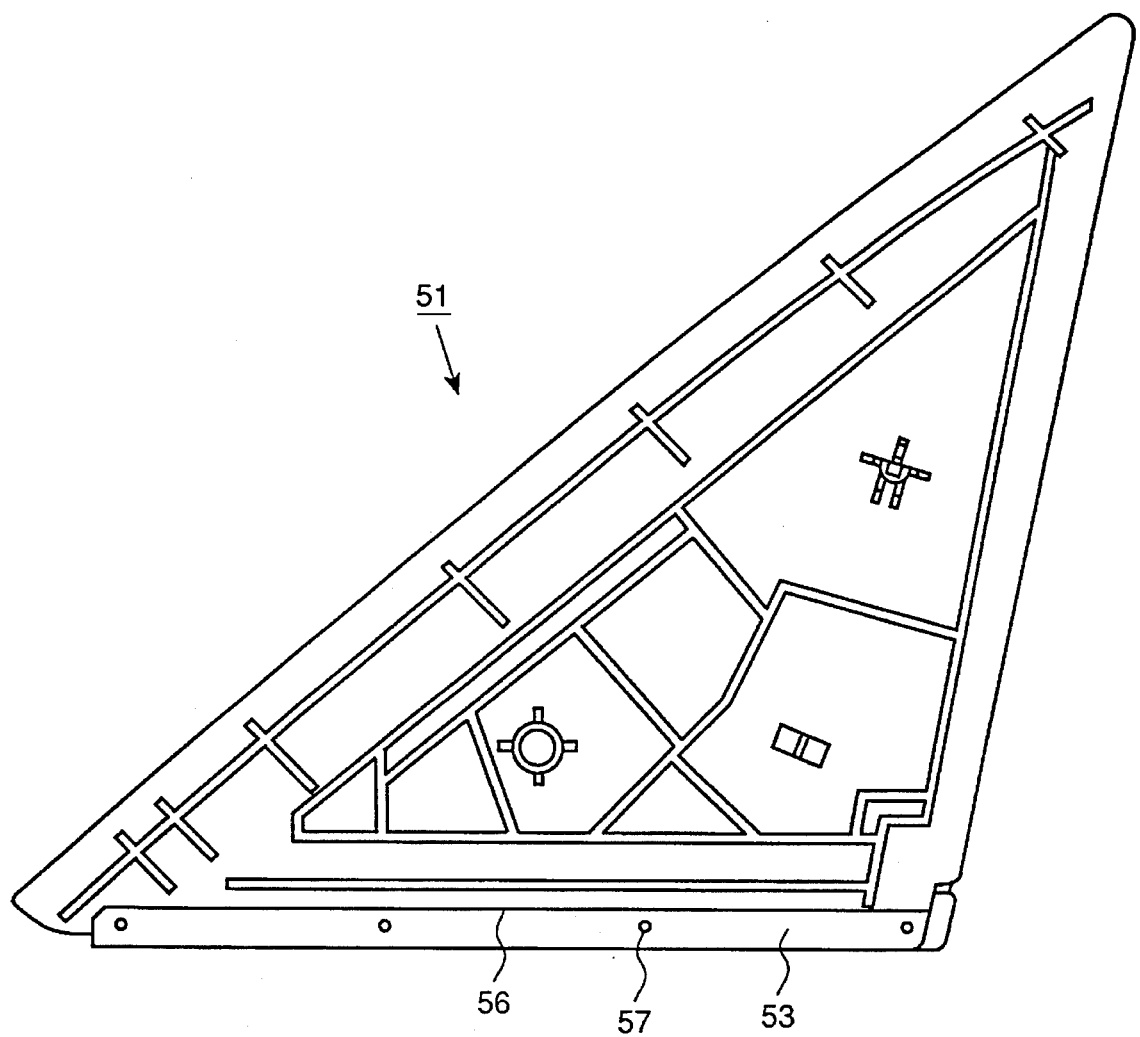
Figure 26:
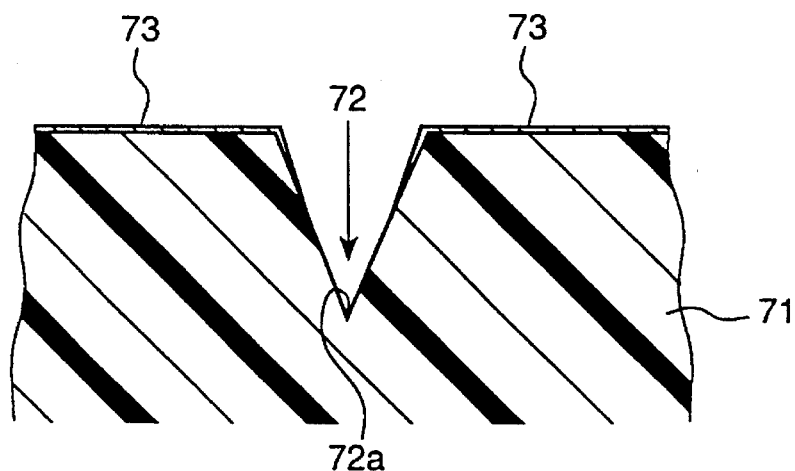
FIG. 26 shows a partial cross-sectional view of a resin product prepared according to the prior art technique, in which a chemical plating is applied on the base material thereof.
Figure 27:
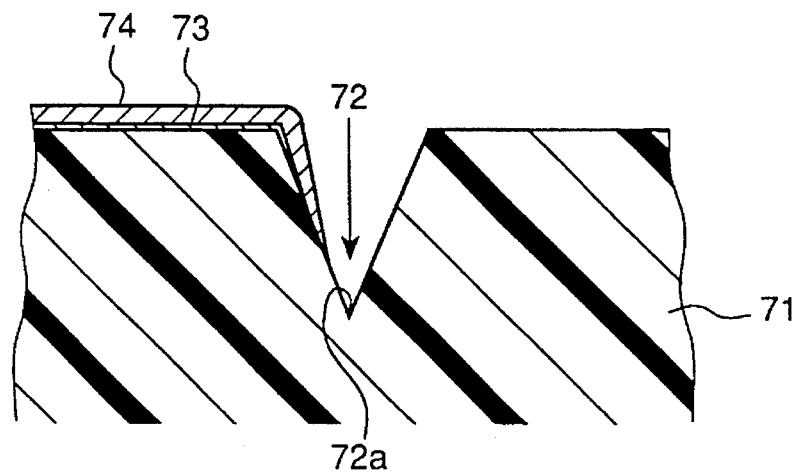
FIG. 27 shows a partial cross-sectional view of the resin material shown in FIG. 26, on which an electroplating is further applied on the chemical plating.

As shown in FIGS. 23 and 25, a contoured groove 56 having a substantially V-shaped cross section is formed at the boundary between the plating layer 53 and the coating layer 54 continuously from the front surface to the rear surface. A wide groove 55 is formed along the groove 56 on the front surface of the outer cover body 52. Further, a protrusion 57 serving as an electrode is formed on the rear surface of the outer cover body 52 to protrude backward therefrom. This protrusion 57 may be removed after completion of plating.

Figure 24:
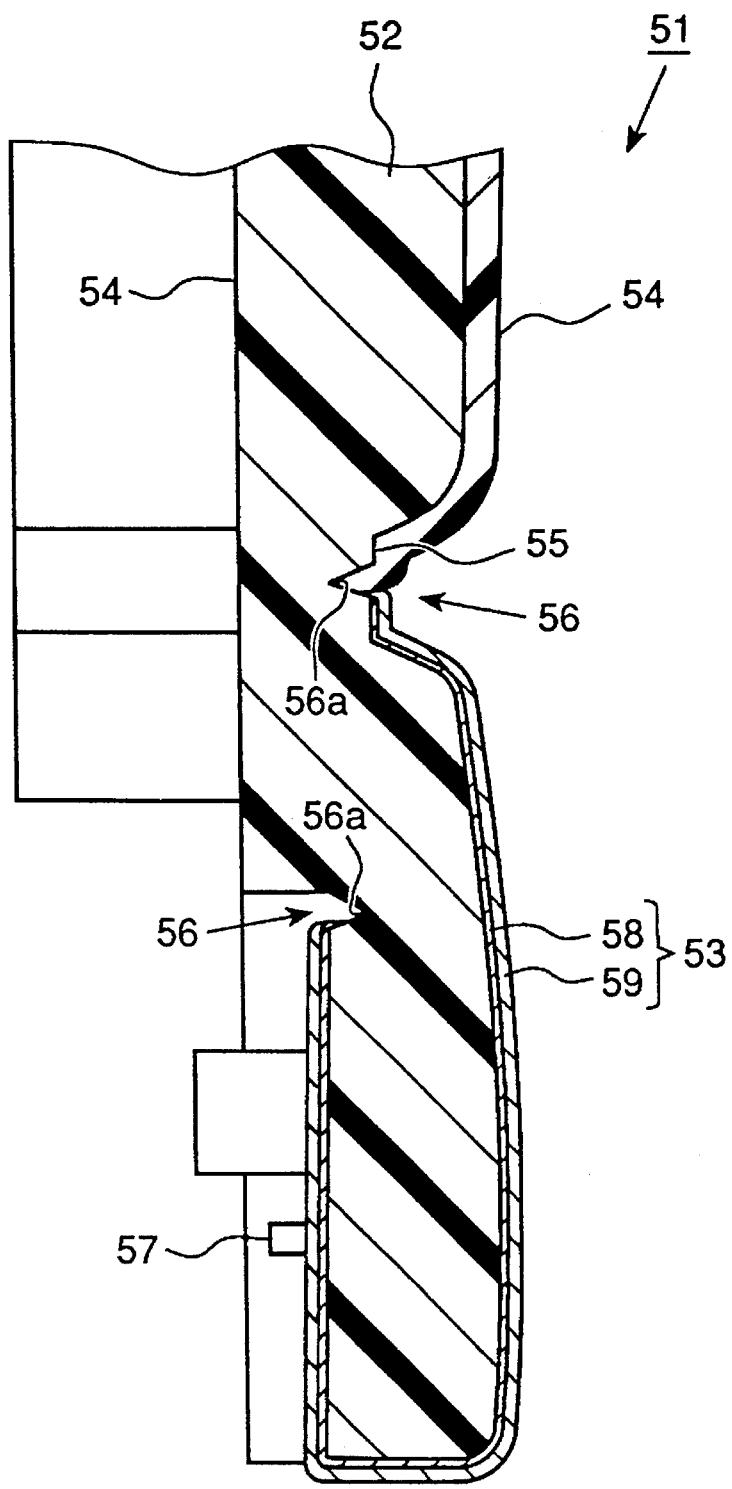

Further, as shown in FIG. 24, the plating layer 53 includes a chemical plating layer 58 and an electroplating layer 59 formed thereon. These layers have the same compositions as described in the above first embodiment.

Next, the process for producing the outer cover 51 for door mirror bracket will be described.

The outer cover body 51 having a contoured groove 56 at a predetermined site is first immersed in a chemical plating solution to form a chemical plating layer. In this process, the bottom 56a remains unplated since it is narrow, but a chemical plating layer 58 is formed on the rest of the portion.

The outer cover body 52 having the chemical plating layer 58 formed thereon is then subjected to electroplating step, where the protrusion 57 formed on the rear surface of the outer cover body 52 serves as an electrode like in the first embodiment. Thus, the chemical plating layer 58 formed on the to-be-unplated portion is dissolved by a predetermined solution during the electroplating step. On the other hand, a multi-layered electroplating layer 59 is formed on the surface of the chemical plating layer 58 present on the to-be-plated portion (the lower part in FIG. 24). Thus, an outer cover body 52 on which the plating layer 53 including the chemical plating layer 58 and the electroplating layer 59 is formed on the to-be-plated portion only can be obtained.

Subsequently, the portion on which the plating layer 53 is formed is covered with an electroforming mask (not shown) in the same manner as in the first embodiment, and the portion exposed from the electroforming mask is coated with a coating material by means of spraying to form a coating layer 54 on the to-be-coated portions. After the coating layer 54 is formed, the electroforming mask is removed to provide the outer cover 51. Although this embodiment is different from the first and second embodiments in that the wide groove 55 is formed on the front surface only and that the contoured groove 56 is formed continuously from the front surface to the rear surface of the outer cover body 52, it exhibits the same actions and effects as in the preceding embodiments.

Although three embodiments of the present invention have been described herein, it should be apparent to those skilled in the art that the present invention may be embodied in many other specific forms without departing from the spirit or scope of the invention.

Particularly, it should be understood that the present invention may be embodied in the following manner:

The present invention may also be embodied in other automotive parts such as a back panel, a louver, a pillar garnish, a quarter vent and a mark plate. The present invention is not limited to the resin pro duets as described above, and it may be embodied in other resin pro duets having plating layers and coating layers.

Resin materials other than ABS resins, such as polypropylene, polyphenylene oxide, polyamide, polysulfone and polyester, earl be employed as the base material.

The chemical plating layers 15, 39, 58 may be formed by metals other than copper or nickel. While the electroplating layers 16, 40, 59 may be formed using other metals than the above three metals, i.e. copper, nickel and chromium, the plating layer may not have a multi-layered structure.

In the above first embodiment, while the upper and lower edges in the boundary between the groove 11 and the surface of the grille body 2 are both rounded along r2 in cross section in FIG. 7, only one of them may be allowed to have such cross section. The cross sections of the edges at the boundary may not necessarily be rounded.

The profile of the groove and that of the portion there around are not limited to the above embodiments, so long as, when the plating layers 3, 33, 53 are covered with the electroforming masks 27, 41, the edges of the electroforming masks 27, 41 may accurately be registered with the edges of the plating layers 3, 33, 53.

In the first to third embodiments, the electroplating step includes a plurality of steps including undercoat plating step to form electroplating layers 16, 40, 59. However, the order of the steps in the electroplating step, the plating runs and the kind of plating may not particularly be limited.

In the first embodiment, hydrochloric acid and boric acid are added so as to adjust pH of the plating solution in the undercoat plating step to 4 or lower. However, these acids may be replaced with any other acids such as nitric acid, hydrofluoric acid and sulfuric acid. Further, the compositions of the respective plating solutions may not be limited to those described above.

In the first embodiment, the chemical plating layer 15 and the undercoat plating layer 16A are allowed to comprise copper and nickel, respectively, and only the chemical plating layer 15 is adapted to be dissolved in the chemical plating dissolving step by treatment with an aqueous alkaline solution. The chemical plating layer 15 and the undercoat plating layer 16A may contrariwise comprise nickel and copper, respectively, and an aqueous acidic solution may be employed in the chemical plating dissolving step. In the latter case, only the chemical plating layer 15 is dissolved. Such constitution can also exhibit the same actions and effects as in the first embodiment.

Further, both the chemical plating layer 15 and the undercoat plating layer 16A may comprise nickel, and the treatment may be carried out using a separate aqueous acidic solution. In this case, the thickness of the plating layer in which the undercoat plating layer 16 is additionally formed (to-be-plated portion) is greater than the plating layer formed on the to-be-unplated portion, so that the chemical plating layer 15 formed on the to-be-unplated portion dissolves first completely. Accordingly, this embodiment can also exhibit the same actions and effects as in the above embodiment. Moreover, both the chemical plating layer 15 and the undercoat plating layer 16A may comprise the same metal other than nickel (e.g. copper), and both layers 15, 16 on the to-be-plated portions and to-be-unplated portions may be adapted to be dissolved by a predetermined solution.

Therefore, the present examples and embodiments are to be considered as illustrative and not restrictive, and the invention is not to be limited to the details given herein, but may be modified within the scope of the appended claims.

We claim:

1. A resin product having a decorative plating layer, comprising:

a resin base material, provided with to-be-plated portions and to-be-unplated portions;

one or more grooves formed on said resin base material so as to define boundaries between said to-be-plated portions and said to-be-unplated portions, said boundaries forming predetermined contour lines and having bottoms;

a decorative plating layer formed on said to-be-plated portions, said decorative plating layer consisting of a chemical plating layer formed on said resin base material and an electroplating layer formed on said chemical plating layer;

a coating layer formed on said to-be-unplated portions; and step sections within said to-be-plated portions, formed along and abutting said grooves, said step sections being utilized as guides to facilitate the positioning of a mask on the plating layer formed on the step sections to insure an appropriate edge at the boundaries when the mask for covering the plating layer is applied to said base material prior to forming said coating layer.

2. The resin product according to claim 1, wherein said grooves have substantially V-shaped cross sections and said bottoms are formed along a radius of curvature r1 of less than 0.1 mm, and the ratio of the width W of said grooves to the depth D thereof satisfies the following equations:

$$D/W > 180 \times r1 - 15.7$$

$$D/W > 6.7 \times r1 + 1.0.$$

3. The resin product according to claim 1, wherein boundaries located between said grooves and said step sections are formed arcuately along a radius of curvature of 0.2 mm or more.

4. The resin product according to claim 1, wherein said grooves and step sections are formed in a manner which ensures said plating layer easily and accurately aligns with the edges of said electro-forming mask.

5. The resin product according to claim 1, wherein said resin product is an automotive exterior equipment.

6. The resin product according to claim 5, wherein said resin product is a front grille.

7. The resin product according to claim 1, wherein said electroplating layer includes a composite plating layer containing a plurality of metals.

8. A process for producing a resin product having a chemical plating layer formed on to-be-plated portions of a resin base material, a decorative electroplating layer formed on said chemical plating layer and a coating layer formed on the remaining portions defined by the edges of said plating layer, said process comprising:

forming predetermined contoured grooves as boundaries so as to define said to-be-plated portions from the to-be-unplated portions and step sections along said boundaries on said base material;

forming a chemical plating layer on the entire surface of said base material except for bottoms of said grooves;

electroplating by electrically charging said to-be-plated portions of said chemical plating layer formed on said base material to form an electroplating layer on said chemical plating layer; and forming a coating layer at least partly on the portions where no electroplating layer is formed, after said plating layer is covered with a mask in such a way that the edges of said mask may accurately be registered with the edges of said plating layer.

9. The process for producing a resin product according to claim 8, wherein said grooves have substantially V-shaped cross sections and the bottoms of the V-shape grooves form the radius of curvature r1 of less than 0.1 mm, and the ratio of the width W of said groove to the depth D thereof satisfies the following equations:

$$D/W > 180 \times r1 - 15.7$$

$$D/W > 6.7 + r1 + 1.0.$$

10. The process for producing a resin product according to claim 8, wherein said boundaries between said grooves and said step sections are formed arcuately along a radius of curvature of 0.2 mm or more.

11. The process for producing a resin product according to claim 8, wherein said grooves and step sections are formed in a manner which ensures that said plating layer easily and accurately aligns with the edges of the electro-forming mask when applied.

12. The process for producing a resin product according to claim 8, wherein electroplating includes immersing said base material in a plurality of plating solutions.

13. The process for producing a resin product according to claim 12, wherein immersing said base material in a plurality of plating solutions includes:

1) electroplating by electrically charging the to-be-plated portions of said chemical plating layer formed on said base material under conditions to form an undercoat plating layer on said chemical plating layer and to allow said chemical plating layer to be exposed at the other portions;

2) immersing said electroplated base material in a predetermined solution to dissolve said exposed chemical plating layer; and 3) electroplating step by electrically charging said undercoat plating layer is under conditions to form a general electroplating layer having a plurality of metal plating layers on said undercoat plating layer.

14. The process for producing a resin product according to claim 13, wherein said undercoat plating layer is of copper, and said predetermined solution is alkaline.

15. The process for producing a resin product according to claim 12, wherein the plating solution employed in said chemical plating step contains nickel ion and the plating solution employed in said first electroplating step in said electroplating step has a pH of 4 or less which results in the simultaneous forming of a first electroplating layer on said chemical plating layer along with dissolving said chemical plating layer present on the to-be-unplated portions.

16. The process for producing a resin product according to claim 15, wherein the plating solution used in the first electroplating step is an undercoat plating solution.

17. The process for producing a resin product according to claim 8, wherein said resin product is an automotive exterior equipment.

18. The process for producing a resin product according to claim 17, wherein said resin product is a front grille.

19. The resin product according to claim 8, wherein the coating material for forming said coating layer is a general purpose coating material which is selected solely for adhesion with said base material.

* * * * *